United States Patent
Lai

(10) Patent No.: US 6,510,061 B1
(45) Date of Patent: Jan. 21, 2003

(54) ELECTRIC FACILITY HAVING AN ANTI-ELECTROMAGNETIC INTERFERENCE DEVICE

(75) Inventor: Chia Ching Lai, Chong Ho (TW)

(73) Assignee: Global Sun Technology Inc., Taipei Hsien (TW)

( * ) Notice: Subject to any disclaimer, the term of this patent is extended or adjusted under 35 U.S.C. 154(b) by 0 days.

(21) Appl. No.: 09/960,763

(22) Filed: Sep. 20, 2001

(51) Int. Cl.[7] ................................................ H05K 9/00
(52) U.S. Cl. ...................... 361/816; 361/752; 361/753; 361/818; 174/35 R; 439/610
(58) Field of Search .................................. 361/728, 736, 361/752, 753, 799, 800, 816, 818; 174/35 R, 36, 35 C; 439/59, 63, 76.2, 607–610

(56) References Cited

U.S. PATENT DOCUMENTS

| | | | |
|---|---|---|---|
| 4,409,641 A | * 10/1983 | Jakob et al. | 361/720 |
| 4,850,884 A | * 7/1989 | Sawai et al. | 439/76.2 |
| 4,869,675 A | * 9/1989 | Ogawa | 439/76.2 |
| 4,941,831 A | * 7/1990 | Tengler et al. | 439/63 |
| 5,045,974 A | * 9/1991 | Ohkoshi et al. | 361/681 |
| 5,243,131 A | * 9/1993 | Jakob et al. | 174/52.1 |
| 5,308,264 A | * 5/1994 | Perretta et al. | 439/607 |
| 5,336,848 A | * 8/1994 | Katz | 174/35 R |
| 5,403,193 A | * 4/1995 | Ito et al. | 439/34 |
| 6,234,840 B1 | * 5/2001 | Nakata et al. | 439/607 |

* cited by examiner

*Primary Examiner*—Jayprakash N. Gandhi

(57) ABSTRACT

An electric facility a cover secured on a primary circuit board and having one or more orifices, a secondary circuit board disposed on the primary circuit board and having one or more sockets engaged through the orifices of the cover, and one or more cables each having a plug for engaging into the socket and for coupling to the secondary circuit board. The secondary circuit board is received in a housing for being prevented from EMI. The plug and the socket each has a conductor coupled together and shielded by the plug and the socket for being prevented from EMI.

12 Claims, 4 Drawing Sheets

ELECTRIC FACILITY HAVING AN ANTI-ELECTROMAGNETIC INTERFERENCE DEVICE

BACKGROUND OF THE INVENTION

1. Field of the Invention

The present invention relates to an electric facility, and more particularly to an electric facility having a device for anti-electromagnetic interference purposes.

2. Description of the Prior Art

Typical electric facilities comprise a number of electric parts or elements disposed on a circuit board, and one or more high frequency cables attached thereto or disposed close thereto. An electromagnetic action or field may be generated by or in the high frequency cables, and may thus generate noises or miscellaneous or unwanted signals or the like in the electric parts or elements; i.e., the electric parts or elements may be interfered by the electromagnetic action or the electromagnetic field generated by or in the high frequency cables. This is so-called the anti-electromagnetic interference (abbreviated as EMI hereinafter). Accordingly, how to eliminate or decrease the EMI against the electric facility will become more and more important.

The present invention has arisen to mitigate and/or obviate the afore-described disadvantages of the conventional electric facilities.

SUMMARY OF THE INVENTION

The primary objective of the present invention is to provide an electric facility including a device for anti-electromagnetic interference purposes and for preventing noises or miscellaneous or unwanted signals or the like from being generated in the electric parts or elements.

In accordance with one aspect of the invention, there is provided an electric facility comprising a primary circuit board, a cover secured on the primary circuit board, the cover including at least one orifice formed therein, a circuit unit disposed on the primary circuit board and received in the cover, and including at least one socket engaged through the orifice of the cover, and a cable including a first end having a plug provided thereon, the plug including a tube extended therefrom for engaging into the socket and for coupling to the circuit unit.

The circuit unit includes a secondary circuit board having a first conductor engaged in the socket of the circuit unit. The plug includes a second conductor engaged in the tube for engaging with the first conductor of the socket. The conductors may be suitably shielded or protected within the socket and the tube and may thus be further prevented from being interfered by the outer electromagnetic field or environment or may be prevented from the EMI.

The circuit unit includes a housing for receiving the secondary circuit board and for shielding the secondary circuit board. The housing is preferably a metal housing. The secondary circuit board may be suitably shielded by the housing which may prevent the secondary circuit board from being interfered by the outer electromagnetic field or environment or may prevent the EMI against the secondary circuit board.

The cover includes at least one ear extended therefrom and provided around the orifice of the cover for engaging with the socket and for grounding the socket.

A device is further provided for positioning the circuit unit on the primary circuit board and includes a seat disposed on the primary circuit board for supporting the circuit unit.

The circuit unit includes at least one notch formed therein, the seat includes at least one projection extended therefrom and engaged into the notch of the circuit for securing the circuit unit on the primary circuit board.

The positioning device includes a row of pins disposed and extended on the primary circuit board for engaging with and for positioning the circuit unit relative to the primary circuit board.

The primary circuit board includes at least one groove formed therein, the cover includes at least one hook extended for engaging into the groove of the primary circuit board and for securing the cover on the primary circuit board, the cover includes at least one reinforcing rib provided thereon for reinforcing purposes.

The primary circuit board includes a coupler disposed thereon, the cover includes a plurality of flaps extended therefrom for engaging onto the coupler of the primary circuit board and for positioning the cover on the primary circuit board.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
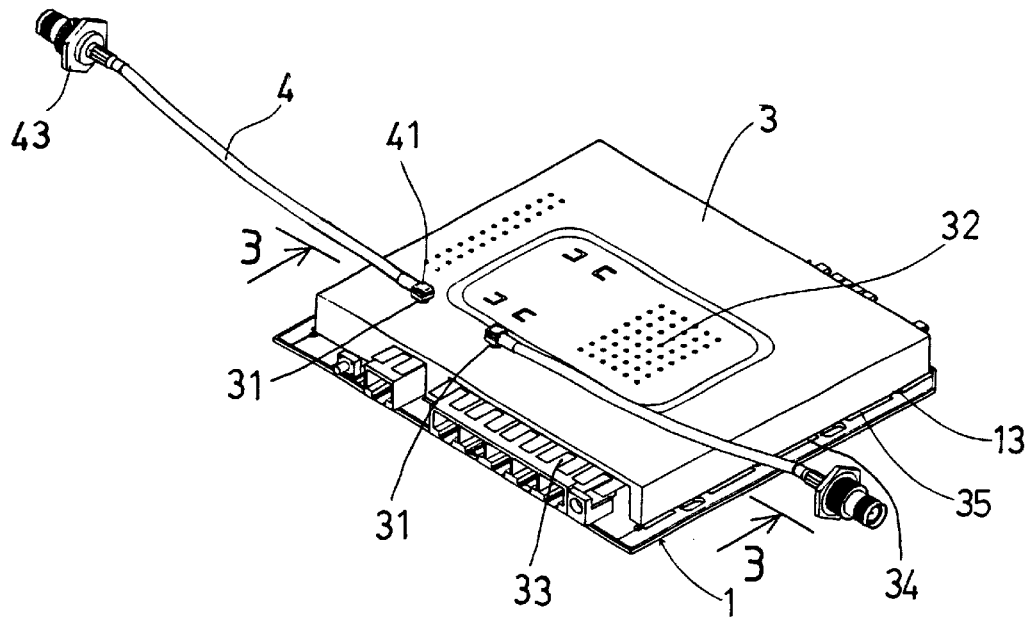
FIG. 1 is a perspective view of an electric facility in accordance with the present invention.
Figure 4:
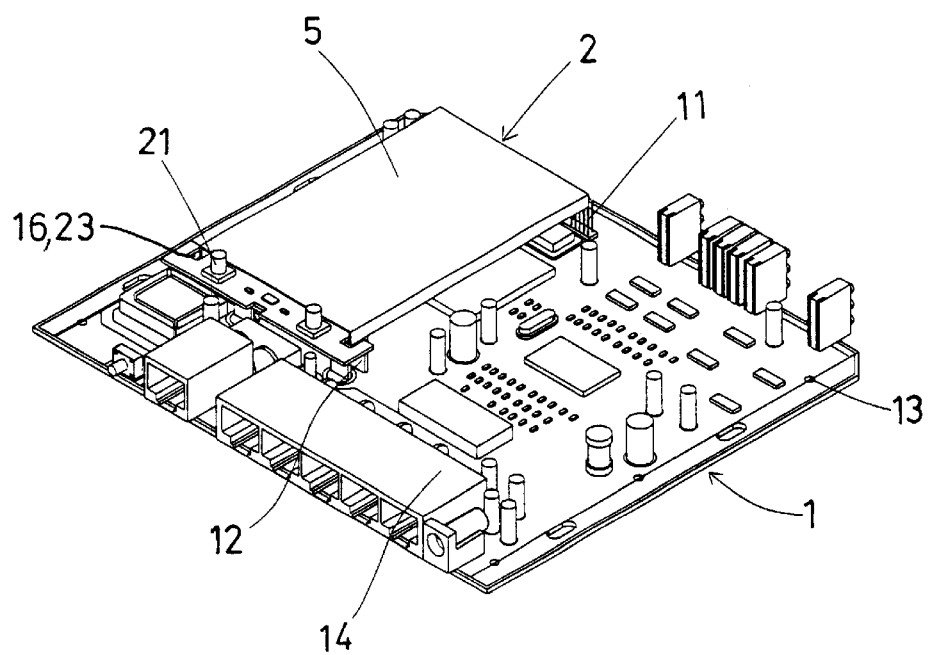
FIG. 4 is a perspective view of a primary circuit board.
Figure 2:
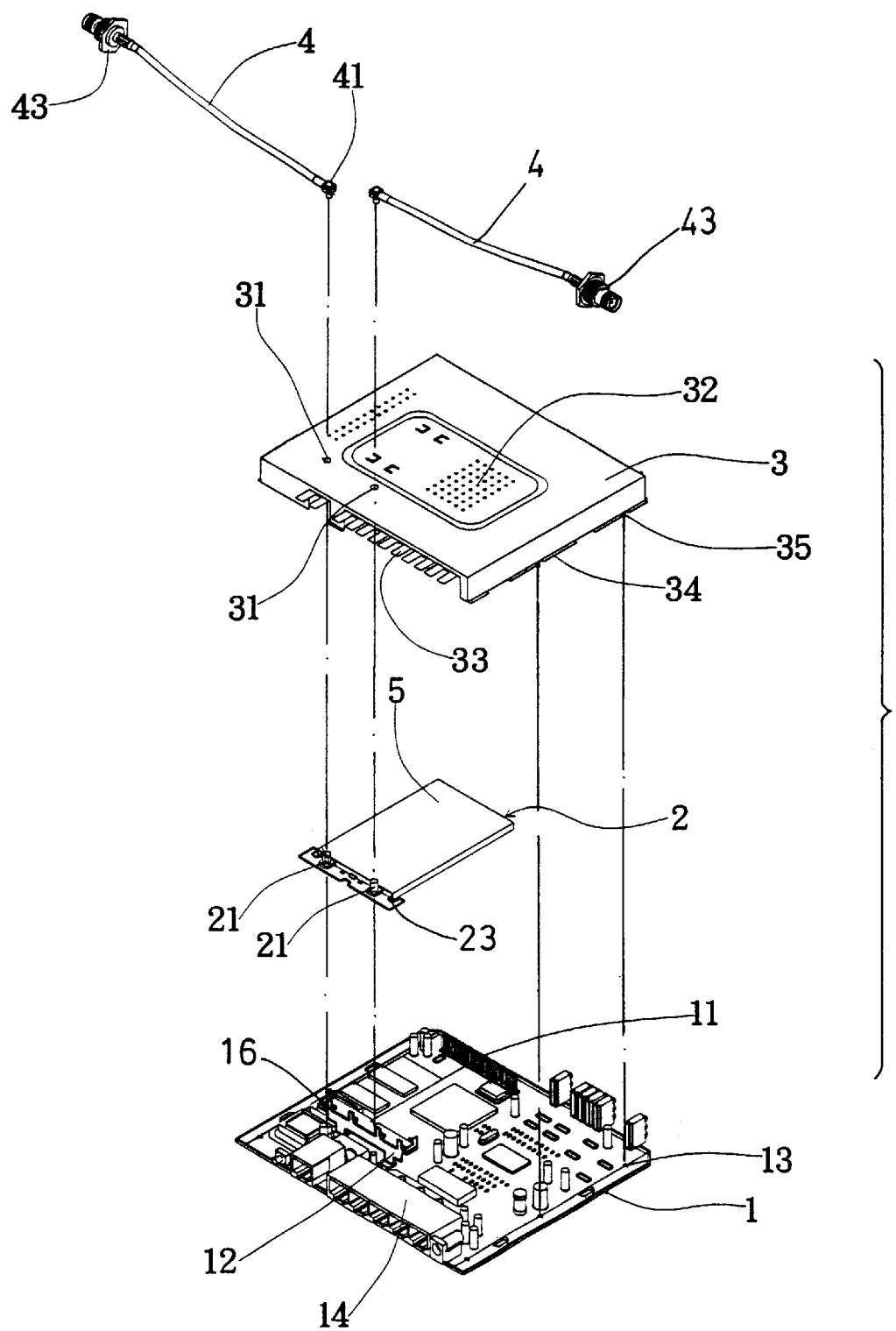
FIG. 2 is an exploded view of the electric facility.

Referring to the drawings, and initially to FIGS. 1–4, an electric facility in accordance with the present invention comprises a primary circuit board 1 including one or two sides each having one or more grooves 13 formed therein, and including a row of pins 11, such as metal pins extended therefrom, and including a seat 12 disposed thereon and parallel to the row of pins 11 and having one or more projections 16 extended upward therefrom. A socket or a coupler 14 is disposed on the primary circuit board 1 for coupling to the other electric facilities with plugs and/or cables etc.

Figure 5:
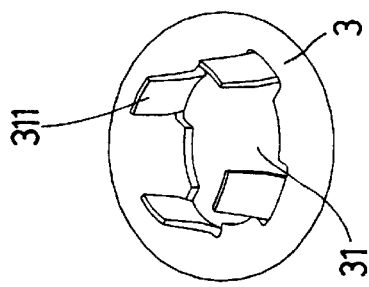
FIG. 5 is a partial perspective view of a cover.
Figure 6:
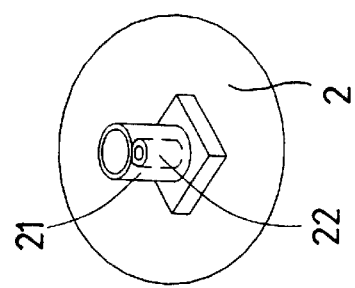
FIG. 6 is a partial perspective view of a circuit module or a circuit unit.

A cover 3 is secured onto the primary circuit board 1 and includes one or more orifices 31 formed therein, and includes a number of apertures 32 formed therein for air circulating purposes and/or for heat dissipating purposes, and includes one or more flaps 33 extended therefrom for engaging onto the coupler 14 of the primary circuit board 1 and for positioning the cover 3 on the primary circuit board 1, and includes one or more reinforcing ribs 34 (FIGS. 1–3) for reinforcing purposes, and includes one or more hooks 35 for engaging through the grooves 13 of the primary circuit board 1 and for firmly or solidly securing the cover 3 onto the primary circuit board 1. As shown in FIG. 5, the cover 3 includes one or more ears 311 extended upward therefrom and provided around each of the orifices 31 thereof. The cover 3 may prevent the noises or miscellaneous or unwanted signals or the like generated by the electric parts or elements of the primary circuit board 1 from being transmitted outward of the cover 3.

A circuit module or a circuit unit 2 includes one or more notches 23 formed therein, such as formed in the one side portion of in the front portion thereof, for receiving the projections 16 of the seat 12, and for securing the circuit unit 2 on the primary circuit board 1, and includes one or more sockets 21 extended upward therefrom and aligned or engaged through the orifices 31 of the cover 3. The other side portion or the rear portion of the circuit unit 2 is engaged with the row of pins 11 which may align or calibrate or position the circuit unit 2 relative to the primary circuit board 1. The sockets 21 of the circuit unit 2 are contacted with and engaged with the ears 311 of the cover 3 for grounding purposes.

The circuit unit 2 includes a secondary circuit board 20 (FIG. 3) received or secured in a metal housing 5 which may insulate or isolate the secondary circuit board 20 from the outer electromagnetic field or environment generated by the other electric parts or elements or cables, and which may thus prevent the secondary circuit board 20 from being interfered by the outer electromagnetic field or environment. The secondary circuit board 20 each includes a conductor 22 attached thereto or extended therefrom and engaged in the socket 21 for further preventing the conductor 22 and thus the secondary circuit board 20 from being interfered by the outer electromagnetic field or environment.

Figure 7:
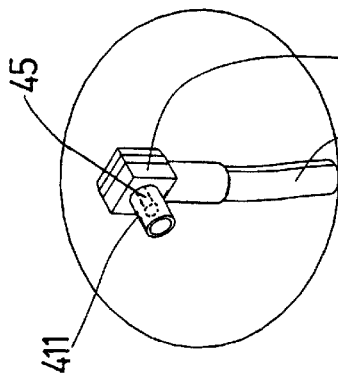
FIG. 7 is a partial perspective view of an electric cable.
Figure 8:
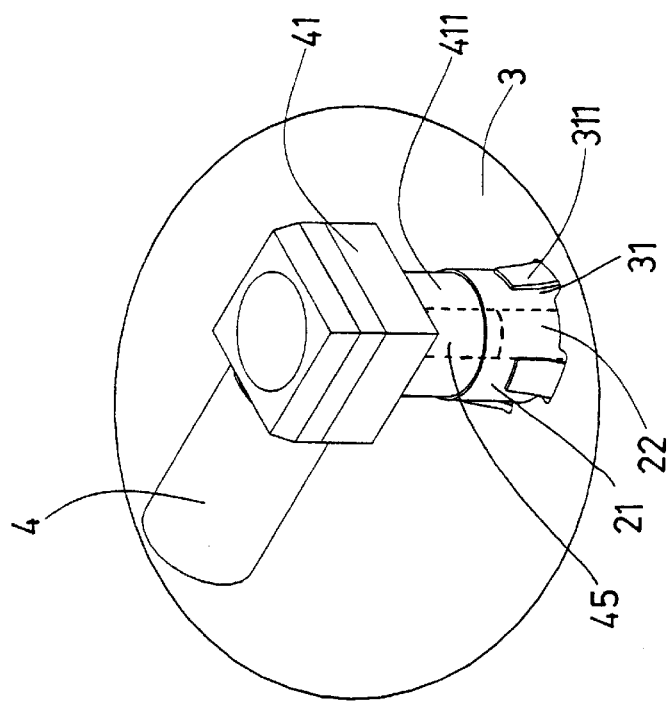
FIG. 8 is a partial perspective view illustrating the engagement of the electric cable to the socket of the circuit module or the circuit unit of the electric facility.

One or more cables 4 each includes a plug 41 provided or disposed on one end thereof and having a tube 411 for engaging into the respective sockets 21 of the circuit unit 2 and having a conductor 45 disposed in the tube 411 (FIGS. 7, 8) for electrically coupling to the conductor 22 of the socket 21 (FIG. 8). The conductors 22, 45 may be suitably shielded or protected within the socket 21 and the tube 411 and may thus be further prevented from being interfered by the outer electromagnetic field or environment. The cables 4 each includes a connector 43 provided or disposed on the other end thereof for coupling to the other electric facilities and/or to the antennas.

Figure 3:
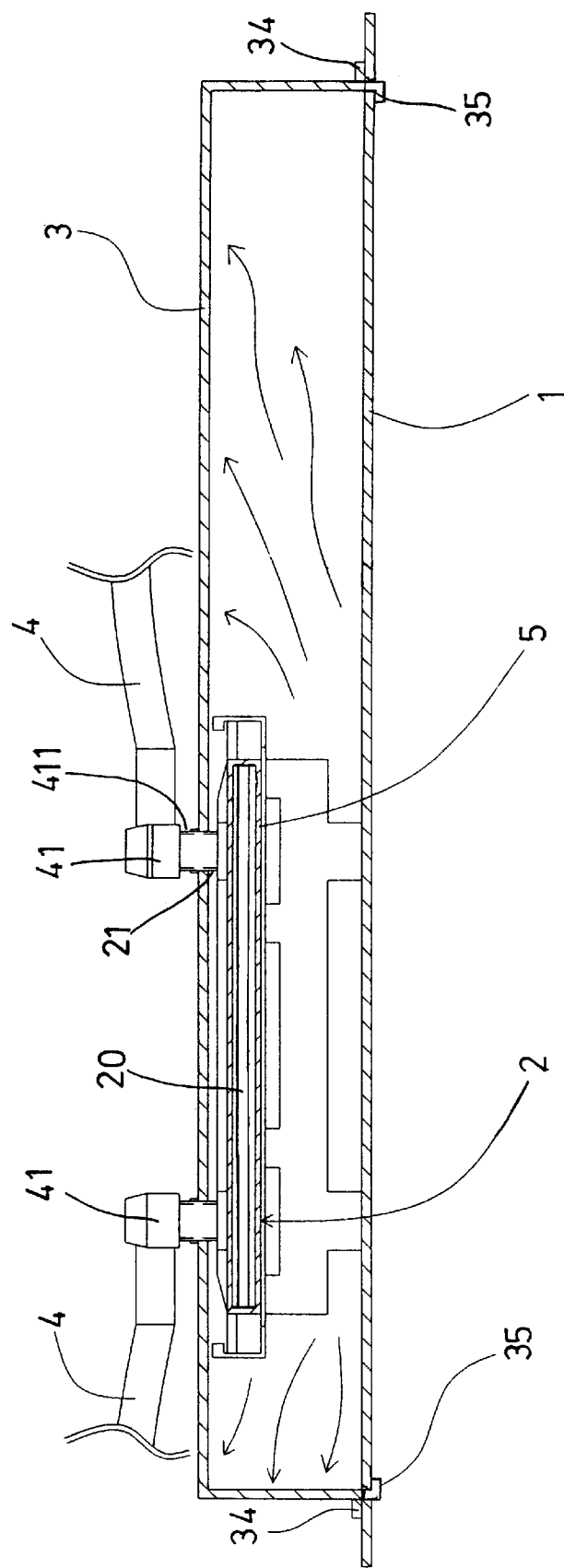
FIG. 3 is a cross sectional view taken along lines 3—3 of FIG. 1.

In operation, as shown in FIGS. 3 and 8, the conductor 22 of the socket 21 may be coupled to the conductor 45 of the plug 41 of the cable 4, and may be coupled to the secondary circuit board 20. The secondary circuit board 20 may be suitably shielded by the housing 5 which may prevent the secondary circuit board 20 from being interfered by the outer electromagnetic field or environment or may prevent the EMI against the secondary circuit board 20. In addition, the conductors 22, 45 may also be suitably shielded or protected within the socket 21 and the tube 411 and may thus be further prevented from being interfered by the outer electromagnetic field or environment or may be prevented from the EMI.

Accordingly, the electric facility in accordance with the present invention includes a device for anti-electromagnetic interference purposes and for preventing noises or miscellaneous or unwanted signals or the like from being generated in the electric parts or elements.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:
1. An electric facility comprising:
   a primary circuit board,
   a cover secured on said primary circuit board, said cover including at least one orifice formed therein,
   a circuit unit disposed on said primary circuit board and received in said cover, and including at least one socket engaged through said at least one orifice of said cover, and
   a cable including a first end having a plug provided thereon, said plug including a tube extended therefrom for engaging into said at least one socket and for coupling to said circuit unit.

2. The electric facility according to claim 1, wherein said circuit unit includes a secondary circuit board having a first conductor engaged in said at least one socket of said circuit unit.

3. The electric facility according to claim 2, wherein said plug includes a second conductor engaged in said tube for engaging with said first conductor of said at least one socket.

4. The electric facility according to claim 2, wherein said circuit unit includes a housing for receiving said secondary circuit board and for shielding said secondary circuit board.

5. The electric facility according to claim 4, wherein said housing is a metal housing.

6. The electric facility according to claim 1, wherein said cover includes at least one ear extended therefrom and provided around said at least one orifice of said cover for engaging with said at least one socket and for grounding said at least one socket.

7. The electric facility according to claim 1 further comprising means for positioning said circuit unit on said primary circuit board.

8. The electric facility according to claim 7, wherein said positioning means includes a seat disposed on said primary circuit board for supporting said circuit unit.

9. The electric facility according to claim 8, wherein said circuit unit includes at least one notch formed therein, said seat includes at least one projection extended therefrom and engaged into said at least one notch of said circuit for securing said circuit unit on said primary circuit board.

10. The electric facility according to claim 7, wherein said positioning means includes a row of pins disposed and extended on said primary circuit board for engaging with and for positioning said circuit unit relative to said primary circuit board.

11. The electric facility according to claim 1, wherein said primary circuit board includes at least one groove formed therein, said cover includes at least one hook extended for engaging into said at least one groove of said primary circuit board and for securing said cover on said primary circuit board, said cover includes at least one reinforcing rib provided thereon for reinforcing purposes.

12. The electric facility according to claim 1, wherein said primary circuit board includes a coupler disposed thereon, said cover includes a plurality of flaps extended therefrom for engaging onto said coupler of said primary circuit board and for positioning said cover on said primary circuit board.

* * * * *

UNITED STATES PATENT AND TRADEMARK OFFICE
Certificate

Patent No. 6,510,061 B1                          Patented: January 21, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Chia Ching Lai, Chong Ho, Taiwan; and I-Tao Chen, Chong Ho, Taiwan.

Signed and Sealed this First Day of July 2003.

<div style="text-align: right;">
DAVID J. BAGNELL<br>
<i>Supervisory Patent Examiner</i><br>
Art Unit 3672
</div>